United States Patent
Oh et al.

(10) Patent No.: US 8,273,612 B2
(45) Date of Patent: Sep. 25, 2012

(54) DISPLAY PANEL AND METHOD OF MANUFACTURING THE SAME

(75) Inventors: Min-Seok Oh, Yongin-si (KR); Yang-Ho Bae, Seoul (KR); Pil-Sang Yun, Seoul (KR); Byeong-Beom Kim, Suwon-si (KR); Seung-Ha Choi, Siheung-si (KR); Sang-Gab Kim, Seoul (KR); Chang-Ho Jeong, Suwon-si (KR); Shin-Il Choi, Seoul (KR); Hong-Kee Chin, Suwon-si (KR); Yu-Gwang Jeong, Yongin-si (KR); Dong-Ju Yang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 90 days.

(21) Appl. No.: 12/981,287

(22) Filed: Dec. 29, 2010

(65) Prior Publication Data

US 2011/0097961 A1    Apr. 28, 2011

Related U.S. Application Data

(62) Division of application No. 12/214,570, filed on Jun. 20, 2008, now abandoned.

(30) Foreign Application Priority Data

Jun. 22, 2007    (KR) ................................ 2007-61693

(51) Int. Cl.
    *H01L 21/84*    (2006.01)

(52) U.S. Cl. ............................... 438/150; 257/E21.414
(58) Field of Classification Search .................. 438/150, 438/159
    See application file for complete search history.

(56) References Cited

U.S. PATENT DOCUMENTS

| 6,008,869 | A | 12/1999 | Oana et al. |
| 6,992,332 | B2 * | 1/2006 | Yamazaki et al. ............... 257/83 |
| 7,262,085 | B2 * | 8/2007 | Gotoh et al. ................... 438/149 |
| 2001/0019125 | A1 | 9/2001 | Hong et al. |
| 2005/0258426 | A1 | 11/2005 | Shin |
| 2007/0040173 | A1 | 2/2007 | Kugimiya et al. |
| 2008/0001153 | A1 | 1/2008 | Urabe et al. |

FOREIGN PATENT DOCUMENTS

JP    2004-363556    12/2004

* cited by examiner

*Primary Examiner* — Chandra Chaudhari
(74) *Attorney, Agent, or Firm* — Innovation Counsel LLP

(57) ABSTRACT

In a display panel and a method of manufacturing the display panel, a gate line, a data line, and source and drain electrodes including a same material as the data line are formed on a substrate constituting the display panel, and the data line includes an aluminum based alloy containing sufficient nickel to inhibit corrosion during dry etching. The corrosion resistance of the AlNi-containing alloy helps prevent corrosion of the data line, the source electrode, and the drain electrode during selective dry etching that shapes these lines and electrodes.

9 Claims, 11 Drawing Sheets

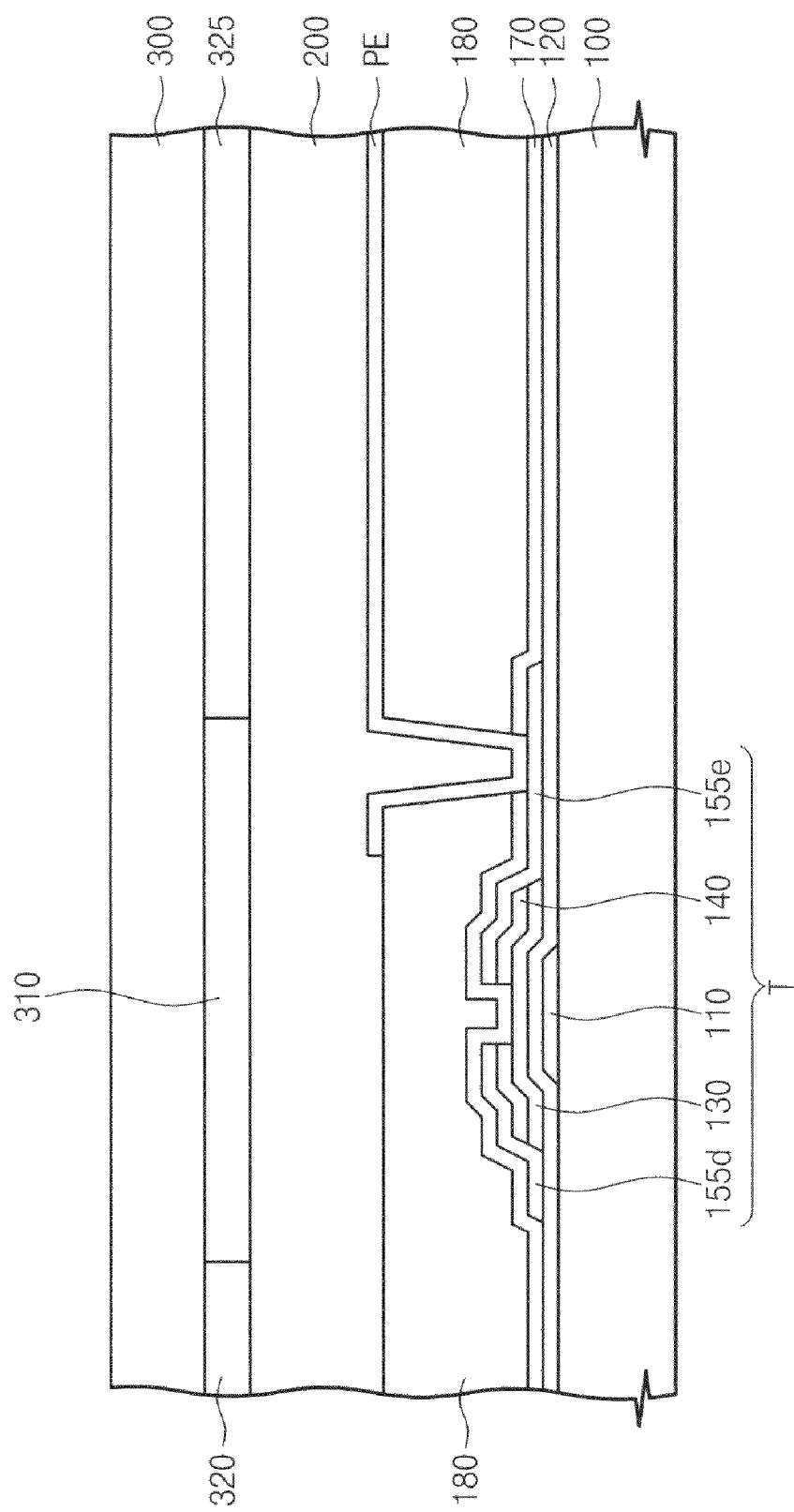

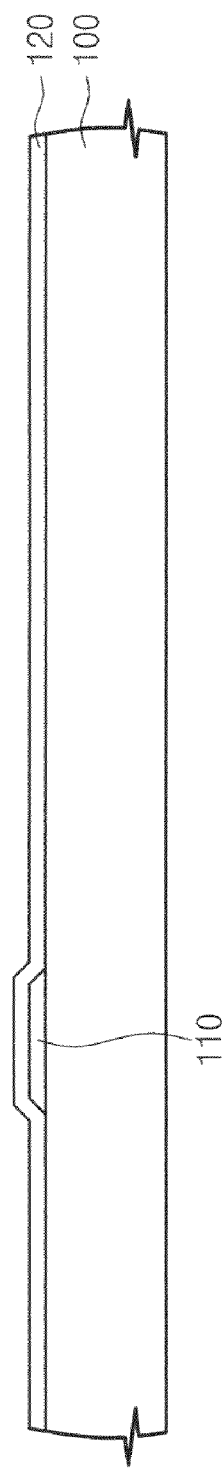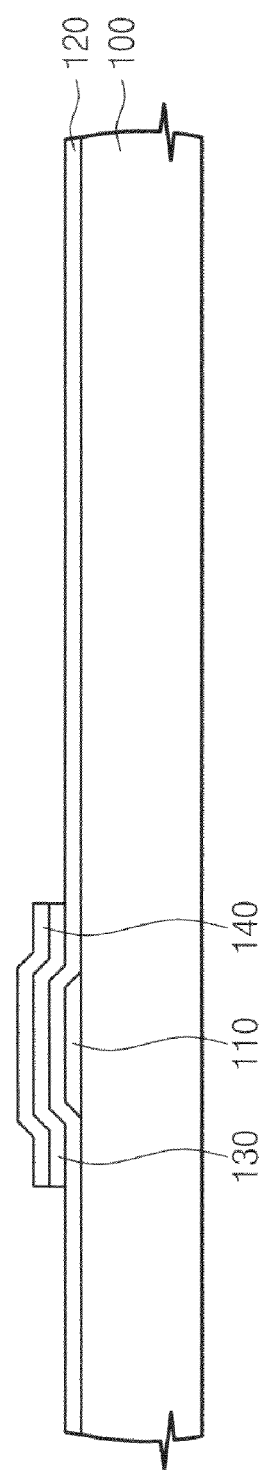

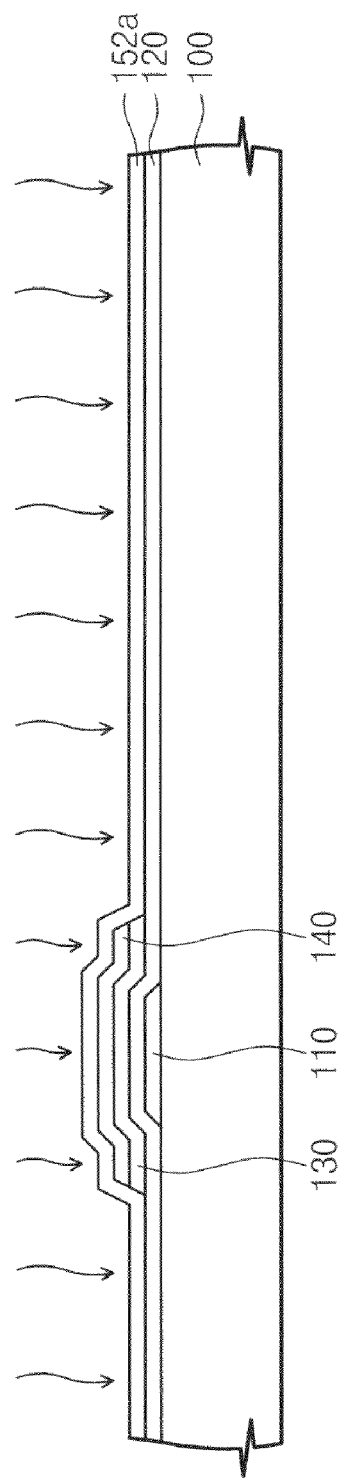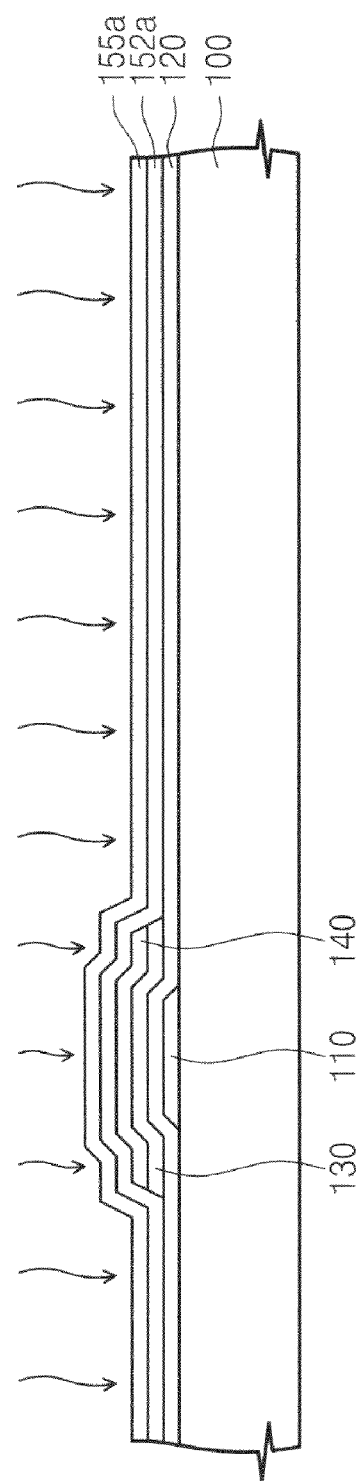

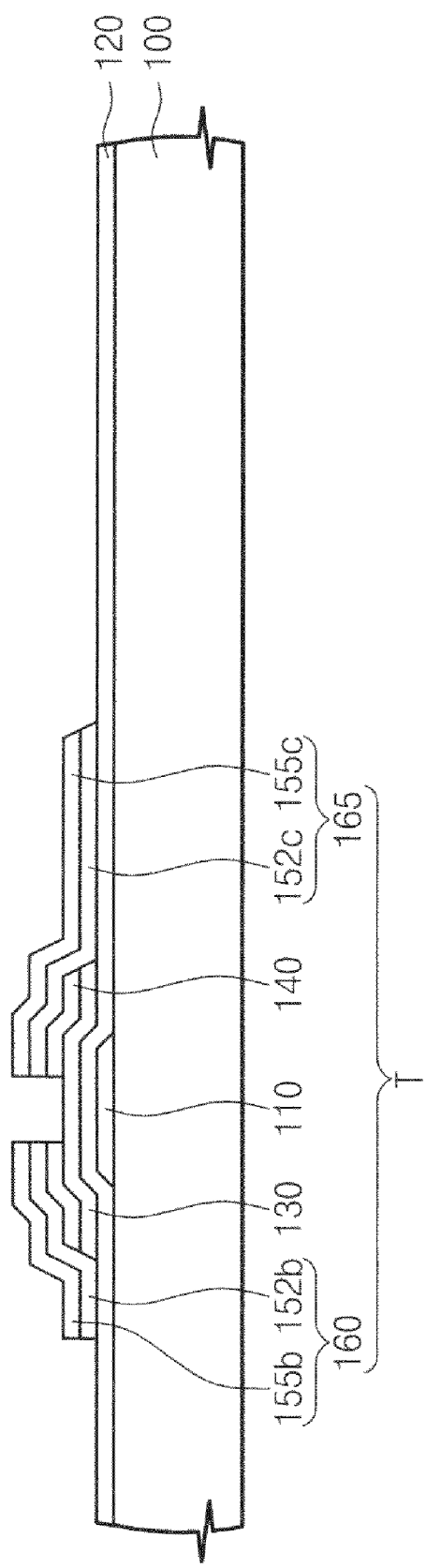

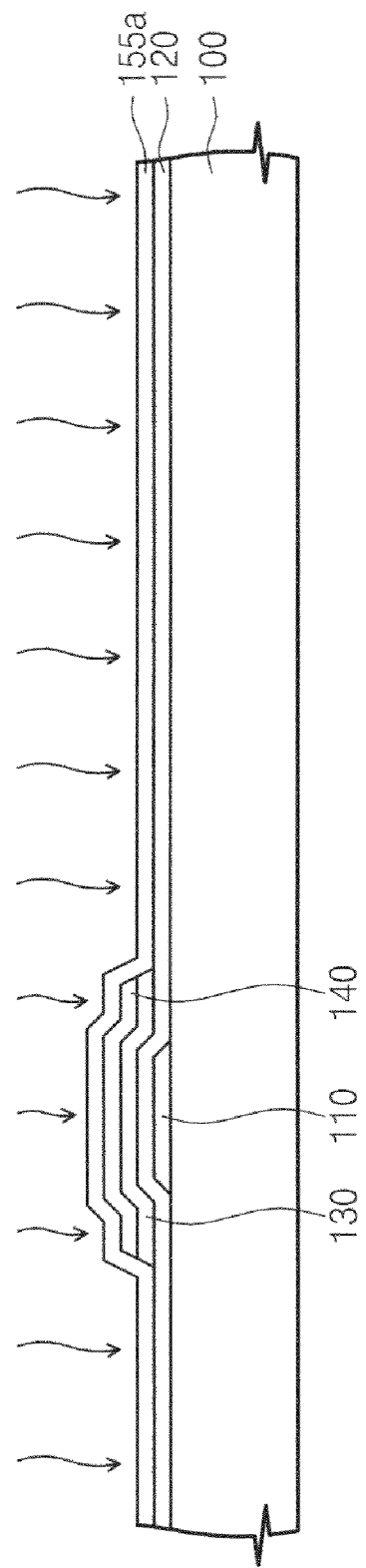

[001]

Fig. 12B
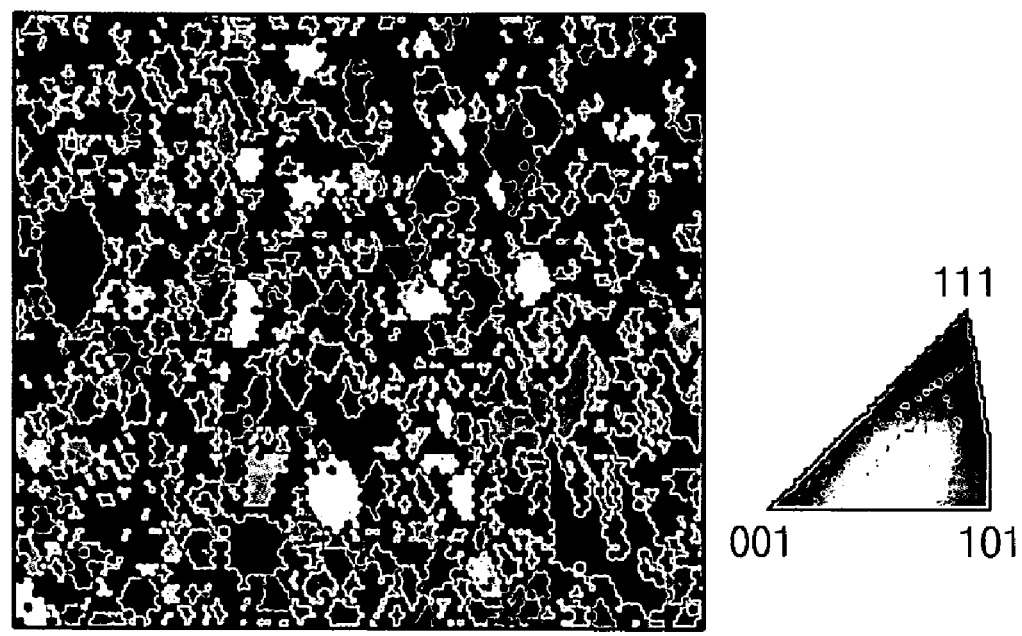
[001]
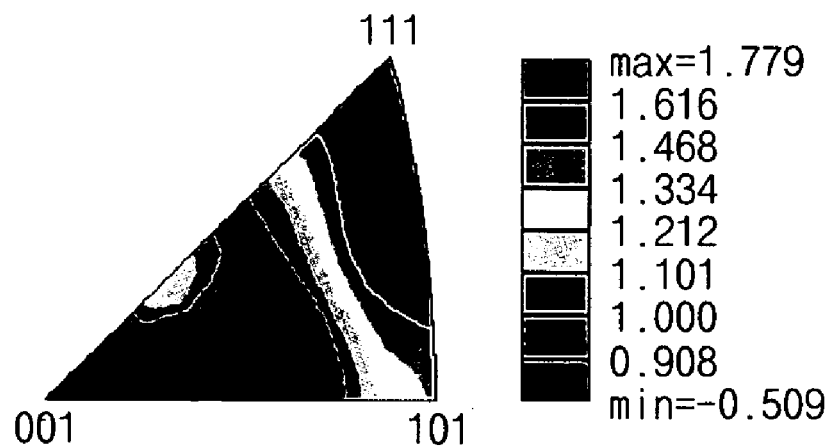

DISPLAY PANEL AND METHOD OF MANUFACTURING THE SAME

CROSS-REFERENCE TO RELATED APPLICATION

This application is a divisional of an claims benefit of U.S. parent application Ser. No. 12/214,570 filed Jun. 20, 2008 where the latter claims benefit of priority from Korean Patent Application No. 2007-61693 filed on Jun. 22, 2007, the disclosures of both of which applications are herein incorporated by reference in their entireties.

BACKGROUND

1. Field of Invention

The present disclosure of invention relates to a display panel and a method of manufacturing the same. More particularly, the present disclosure relates to a display panel capable of reducing a manufacturing cost and a method of manufacturing the display panel

2. Description of Related Technology

In general, a display panel includes a display substrate in which a plurality of pixel areas are defined and an opposite substrate facing the display substrate, where the pixel areas are used to display an image. As an example of a display panel, a liquid crystal display (LCD) panel further includes a liquid crystal layer interposed between the pixel area display substrate and the opposite substrate, and pixel electrodes are arranged on the display substrate and one or more common electrodes on the opposite substrate, respectively. When an intensity of an electric field formed between the opposed electrodes is adjusted, arrangements of liquid crystals of the liquid crystal layer are changed, thereby displaying a desired image on the liquid crystal display panel by using light transmittance varied according to the arrangements of the liquid crystals.

Meanwhile, in order to apply driving signals to the electrodes, respectively, signal transmission lines are formed on the display substrate and the opposite substrate. As designers attempt to make the liquid crystal display panel larger in size, the signal transmission lines become longer. As a result, the driving signals are delayed, and/or suffer loss of voltage due to resistance of the elongated signal transmission lines. However, when materials having low resistance are applied to the signal transmission lines in order to reduce the resistance of the signal transmission lines, additional mass production processes are necessary to for example, prevent the less resistant signal transmission lines from being corroded.

SUMMARY

The present disclosure of invention provides a display panel capable of being mass produced with reduced manufacturing cost.

According to one aspect of the present disclosure, a display panel includes first and second substrates facing each other, gate and data lines arranged on the first substrate to define a pixel area, a source electrode branched from the data line to include a same material as the data line, a drain electrode spaced apart from the source electrode to include a same material as the data line, and a pixel electrode electrically connected to the drain electrode and arranged in the pixel area.

The data line, the source electrode, and the drain electrode include an aluminum alloy containing nickel. The aluminum alloy may further include lanthanum or boron, and the gate line may include a same material as the data line.

Each of the data line, the source electrode, and the drain electrode may have a double-layered structure including a conductive layer. The conductive layer includes at least one of molybdenum, titanium, and tantalum. The conductive layer makes contact with a semiconductor pattern arranged under the source electrode and the drain electrode.

The display panel may be a liquid crystal display panel including liquid crystals interposed between the first and second substrates.

In another aspect of the present invention, a method of manufacturing a display panel is provided as follows. A gate line is formed on a first substrate, a semiconductor pattern is formed to be partially overlapped with the gate line, and a data line is formed on the first substrate to define a pixel area together with the gate line. After forming the data line, a source electrode is branched from the data line and formed in the pixel area, and a drain electrode is spaced apart from the source electrode and formed in the pixel area. Then, a pixel electrode that is electrically connected to the drain electrode is formed in the pixel area, and the first substrate is combined with the second substrate.

The data line, the source electrode, and the drain electrode are formed through the same process. Particularly, the data line, the source electrode and the drain electrodes are formed by forming an aluminum alloy layer (e.g., $Al_xNi_y$ where $y.ltoreq.3\%$, and $x+y=100\%$) primarily containing aluminum but also containing about 3% atomic or less of nickel on the first substrate and patterning the aluminum alloy layer.

The data line, the source electrode, and the drain electrode may include a conductive layer including at least one of molybdenum, titanium, and tantalum. When the data line, the source electrode, and the drain electrode further include the conductive layer, the semiconductor pattern may be formed under the source and drain electrodes and make contact with the conductive layer.

According to the above, the data line, the source electrode, and the drain electrode (e.g., $Al_xNi_y$ where $y<3\%$, and $x+y=100\%$) have a small reactivity to ions, so that a process of removing residue ions on the surface of the aluminum alloy layer may be omitted. Thus, the manufacturing processes for the display panel may be simplified, thereby reducing the manufacturing cost of the liquid crystal display panel.

BRIEF DESCRIPTION OF THE DRAWINGS

The above and other advantages of the present invention will become readily apparent by reference to the following detailed description when considered in conjunction with the accompanying drawings wherein:

FIG. 3 is a sectional view showing another exemplary embodiment of a liquid crystal display panel according to the present invention;

FIGS. 4 to 10 are process views illustrating a method of manufacturing the liquid crystal display panel of FIG. 1; and FIG. 11 is a process view illustrating a method of manufacturing the liquid crystal display panel of FIG. 3.

FIG. 12B is an image illustrating an orientation of crystals in aluminum alloy formed on a conductive layer comprising molybdenum using EBSD.

DETAILED DESCRIPTION

Figure 1:
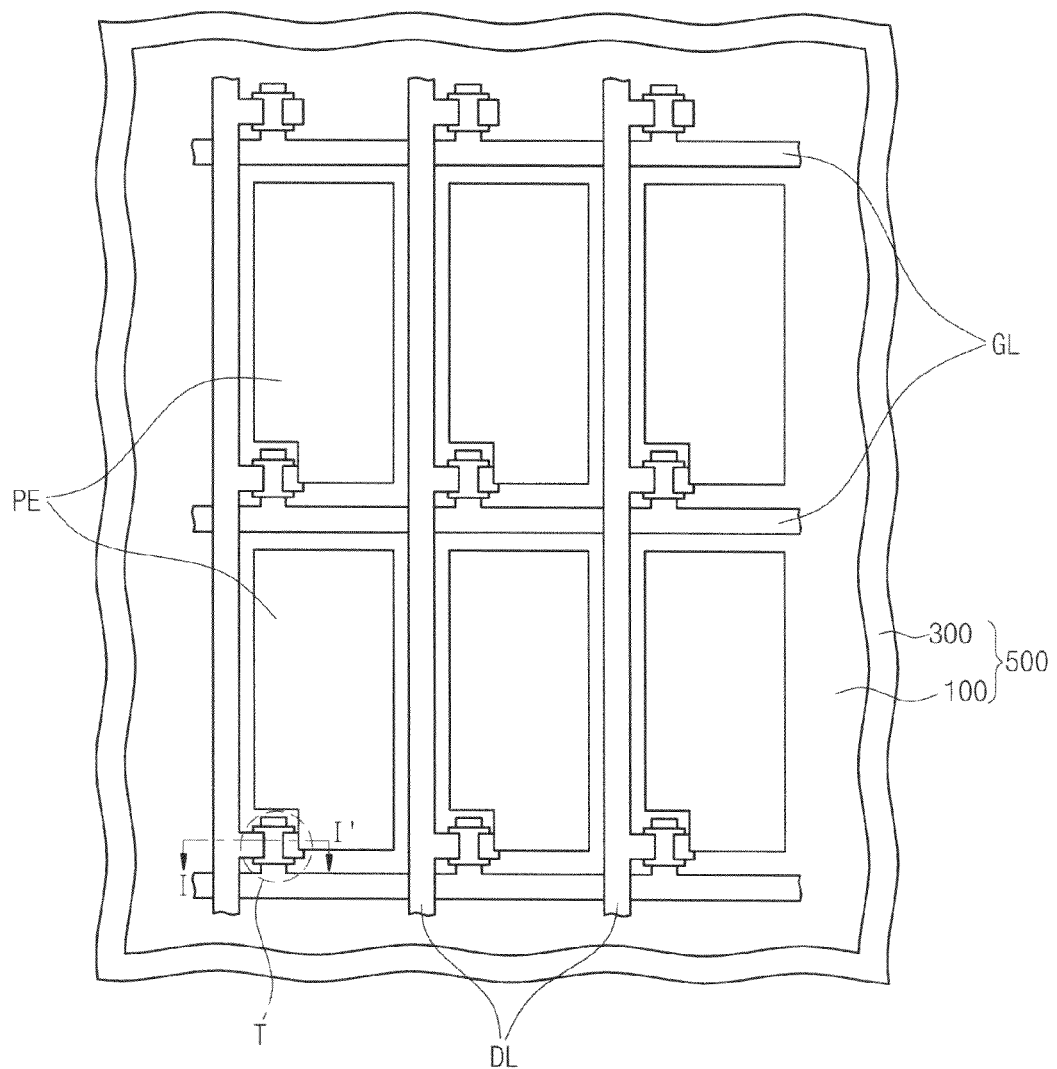
FIG. 1 is a plan view showing an exemplary embodiment of a liquid crystal display panel according to the present invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a plan view showing an exemplary embodiment of a liquid crystal display panel according to the present disclosure.

Referring to FIG. 1, a liquid crystal display 500 includes a first substrate 100, a second substrate 300, and a liquid crystal layer 200 (refer to FIG. 2) interposed between the first substrate 100 and the second substrate 300.

The first substrate 100 includes a transparent glass layer. Data lines DL and gate lines GL are arranged on the first substrate 100 to define correspondingly bounded pixel areas. Pixel electrodes PE are arranged in the pixel areas, respectively, and the pixel electrodes PE and a common electrode (not shown in FIG. 1) generate an electric field to control arrangements of liquid crystal molecules in the liquid crystal layer. Accordingly, the liquid crystal display panel 500 may adjust an amount of light (e.g., polarized light) passing through the first substrate 100 and advancing toward the second substrate 300 by controlling the arrangements of the liquid crystal molecules, thereby displaying a desired image in the pixel areas. Although not shown in FIG. 1 and not explained in detail, the liquid crystal display panel 500 controls the light transmittance according to the arrangements of the liquid crystal molecules and the pixel electrodes PE adjusts the arrangements of the liquid crystal molecules, so that areas in which the pixel electrodes PE are arranged may be deemed as the pixel areas.

Each of the pixel areas includes a thin film transistor T, and the thin film transistor T is electrically connected to a corresponding one pixel electrode of the pixel electrodes PE. The thin film transistor T serves as a switching device. When the thin film transistor T is turned on in response to an activating control signal (Von) applied through a gate line GL, a data signal applied through the data line DL is applied to the pixel electrode PE through the turned on thin film transistor T.

The thin film transistor T includes a gate electrode 110 (refer to FIG. 2) branched from the gate lien GL, a source electrode 160 (refer to FIG. 2) branched from the data line DL, and a drain electrode 165 (refer to FIG. 2) including a same material as the data line DL. In other words, the data line DL, the source electrode, and the drain electrode include the same material, and more particularly in one embodiment, each of the data line DL, the source electrode, and the drain electrode includes an aluminum based alloy layer containing a minor amount of nickel ($Al_x Ni_y Z_z$ where Z is/are optional other metals and $x+y+z=100\%$, where $50\% < x \leq 100\%$ and $y \leq .3\%$) and a conductive layer containing molybdenum (Mo).

Figure 2:
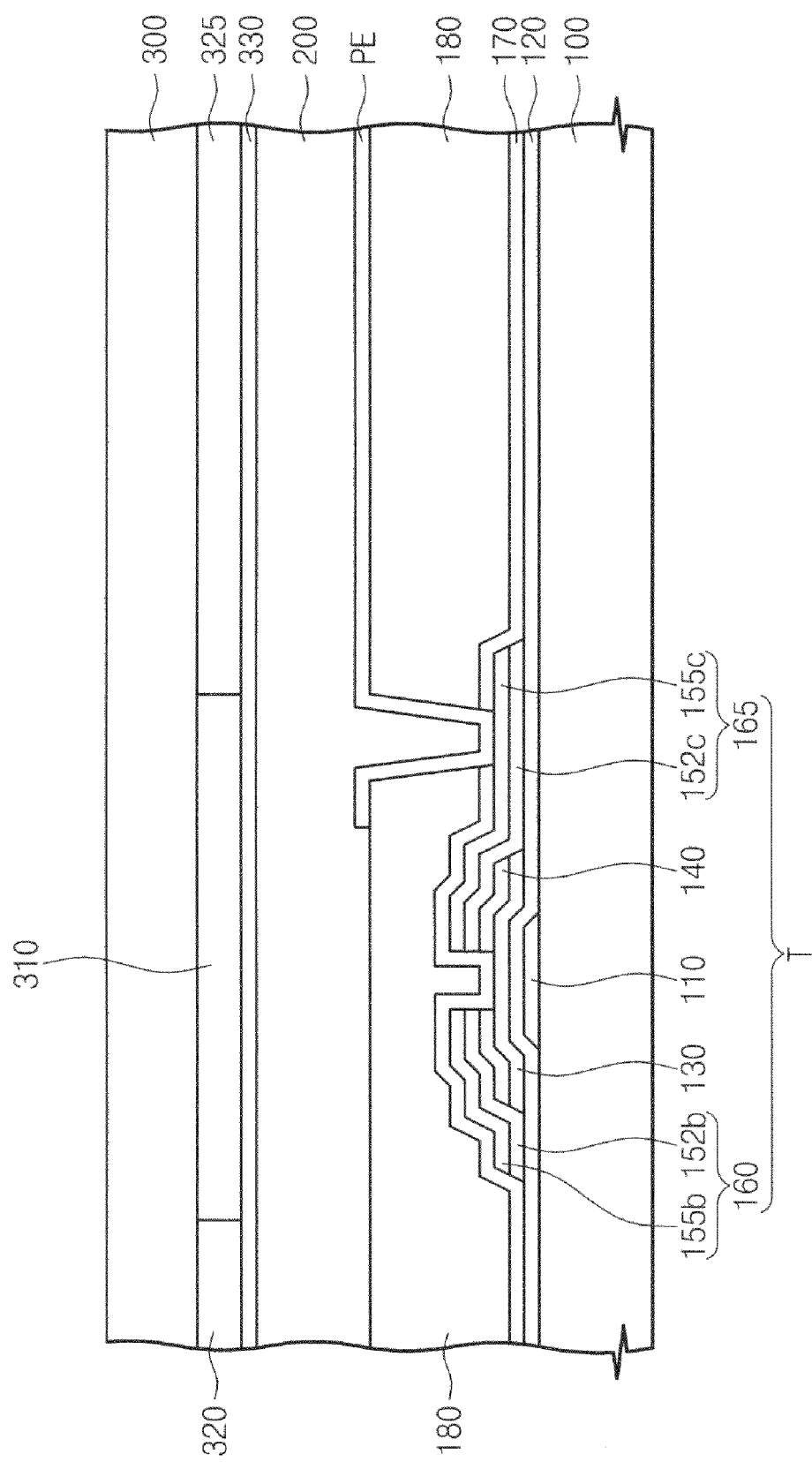
FIG. 2 is a cross-sectional view taken along a line I-I' of FIG. 2.

FIG. 2 is a cross-sectional view taken along a line I-I' of FIG. 2.

Referring to FIG. 2, the second substrate 300 includes a transparent glass layer (also denoted as 300). The second substrate 300 includes a transparent common electrode 330, a light blocking black matrix 310, and differently colored color filters such as 320 and 325.

The common electrode 330 helps to generate the electric field to control the arrangements of the liquid crystal molecules. The black matrix 310 is formed on the second substrate 300 and aligned over the thin film transistor T. Each of the color filters 320 and 325 may include a photoresist material having a specific color pigment incorporated therein to filter prespecified wavelength of white light incident therethrough.

The thin film transistor T includes the gate electrode 110 branched from the gate line GL and arranged on the first substrate 100, an active pattern 130 (a semiconductive layer) overlapped with the gate electrode 110, a subdivided ohmic contact layer 140 whose subdivisions are respectively overlapped with spaced apart portions of the active pattern 130, the aforementioned multilayer (AlNi/Mo) source electrode 160 whose lower Mo-containing sub-layer 152b overlaps with the ohmic contact pattern 140, and the aforementioned multilayer (AlNi/Mo) drain electrode 165 whose lower Mo-containing sub-layer 152c overlaps with the ohmic contact pattern 140, where the drain electrode 165 is spaced apart from the source electrode 160.

In order to inhibit corrosion while enhancing conductivity, each data line DL, each source electrode 160 branching integrally therefrom, and each drain electrode 165 has a double-layered structure with an upper sub-layer composed of an aluminum based alloy containing a minor amount of nickel (Al.sub.xNi.sub.yZ.sub.z, x+y+z=100%, 50%.ltoreq.x.ltoreq.100%, y.ltoreq.3%) and a lower sub-layer of enhanced conductivity that contains molybdenum (Mo). More specifically, as shown in FIG. 2, the source electrode 160 includes a lower first metal pattern 152b containing molybdenum (Mo) and an upper second metal pattern 155b containing aluminum (Al). Also, the drain electrode 165 includes a third metal pattern 152c containing molybdenum and a fourth metal pattern 155c containing aluminum.

Referring to FIG. 6, during mass production, a precursor for defining the Mo-containing first and third metal patterns 152b and 152c are formed by blanket depositing in a sealed process chamber (not shown) a first metal layer 152a containing molybdenum on the first substrate 100 to a thickness of about 50 angstroms to about 1000 angstroms. Referring to FIG. 7, during mass production, a precursor for defining the AlNi-containing second and fourth metal patterns 155b and 155c are formed by blanket deposition in the same sealed process chamber of a second metal layer 155a containing a corresponding aluminum alloy on the first substrate 100. Referring to FIG. 8, during mass production, the blanket deposited first and second metal layers 152a, 155a are thereafter selectively etched to produce the illustrated patterned portions 152b, 152c, 155b, 155c.

When the source electrode 160 and the drain electrode 165 are formed, the AlNi-containing second and fourth metal patterns 155b and 155c are exposed to the etch mechanism (e.g., a dry etch plasma). However, since the exposed second and fourth metal patterns 155b and 155c include the aluminum based alloy with Ni, it has a more superior corrosion resistance than that of aluminum with no significant Ni content therein, and surfaces of the second and fourth metal patterns 155b and 155c will generally not be corroded as much as if aluminum with no significant Ni content had been used.

In conventional LCD's where the data line, the source electrode, and the drain electrode include at their top a metal layer such as of aluminum single element content, this relatively reactive metal surface easily reacts with ions in the etch plasma, so that undesirable compounds are often formed on the surface of the essentially all aluminum metal layer. These by-product compounds from the etch process tend to increase the electrical resistance of the metal layer and to initiate or catalyze corrosion of the essentially all aluminum metal layer, thereby causing eventual loss of signals applied through the data line, source electrode, and the drain electrode. For prevention of those defects in the conventional metal layer, additional processes such as ashing of top surface residues off of the metal layer, and selective removing of the ion-generated byproduct compounds from the essentially all aluminum metal layer, and coating of the Al-containing surface of the metal layer with molybdenum are conventionally performed. However, these multiple steps for curing the problem that is due to the corrodibility of the conventional essentially all aluminum metal layer are time consuming, expensive and increased numbers of distinct process steps during mass production raise the probability of something going wrong.

However, in accordance with the present disclosure, when the data lines DL, the source electrodes 160, and the drain electrodes 165 include the aluminum based alloy containing a sufficient amount of nickel for substantially inhibiting formation of the etch byproducts (Al.sub.xNi.sub.yZ.sub.z where Z is/are optional other metals and x+y+z=100%, where 50%<x.ltoreq.100% and 0<y.ltoreq.3%), the data lines DL, the source electrodes 160, and the drain electrodes 165 may exhibit a corrosion resistance that is much superior to that of when the data line DL, the source electrode 160, and the drain electrode 165 include the essentially all aluminum metal layer where essentially no amount of nickel (Ni) is present for inhibiting corrosion. Accordingly, the data lines DL, the source electrodes 160, and the drain electrodes 165 formed in accordance with the present disclosure may be prevented from being reacted with ions, to thereby prevent the byproduct compounds from being generated on the surfaces of the data line DL, the source electrode 160, and the drain electrode 165. As a result, the additional processes such as ashing of residues on the data line DL, the source electrode 160, and the drain electrode 165, selective removing of the ion induced byproducts on the data line DL, the source electrode 160, and the drain electrode 165 may be omitted, therefore simplifying the manufacturing processes for the liquid crystal display panel and reducing the manufacturing cost of the liquid crystal display panel.

Further, since the AlNi-containing aluminum alloy of the present disclosure may be readily connected electrically and directly to the transparent conductive material of the pixel electrode PE, additional interface metal layers such as those containing molybdenum do not need to be formed on the drain electrode 165. Therefore, the manufacturing processes may be further simplified and the process time may be further shortened.

The Mo-containing first and third metal patterns 152b and 152c including molybdenum make contact with the ohmic contact pattern 140 to reduce the contact resistance between the ohmic contact pattern 140 and the AlNi-containing second metal pattern 155b and between the ohmic contact pattern 140 and the fourth metal pattern 155c. In addition to or in place of Mo; Ta and/or Ti may be used. Consequently, since good ohmic contact is made, currents may be easily moved between the source electrode 160 and the drain electrode 165 through the active pattern 130 that serves as the channel layer of the thin film transistor T.

Also, the Mo/Ti/Ta-containing first and third metal patterns 152b and 152c prevent aluminum atoms from being diffused from the second and fourth metal patterns 155b and 155c to the active pattern 130 and the ohmic contact pattern 140. In the case where the active pattern 130 and the ohmic contact pattern 140 include amorphous silicon, the AlNi-containing second and fourth metal patterns 155b and 155c may have the aluminum atoms that are more densely grown (more concentrated as a lattice structure) when the second and fourth metal patterns 155b and 155c are first formed on (seeded upon) the first and third Mo/Ti/Ta-containing metal patterns 152b and 152c than when the second and fourth metal patterns 155b and 155c are directly formed on (seeded upon) the amorphous silicon.

In general, as the atoms constituting a solid state material are arranged in a more dense lattice structure, other atoms are not as easily diffused through the more dense solid state material. Thus, the Mo/Ti/Ta-containing first and third metal patterns 152b and 152c may prevent the diffusion of the aluminum atoms from the second and fourth metal patterns 155b and 155c to contaminate the active pattern 130 and the ohmic contact pattern 140, thereby preventing occurrence of a black dot on the ohmic contact pattern 140 and the active pattern 130.

Figure 12A:
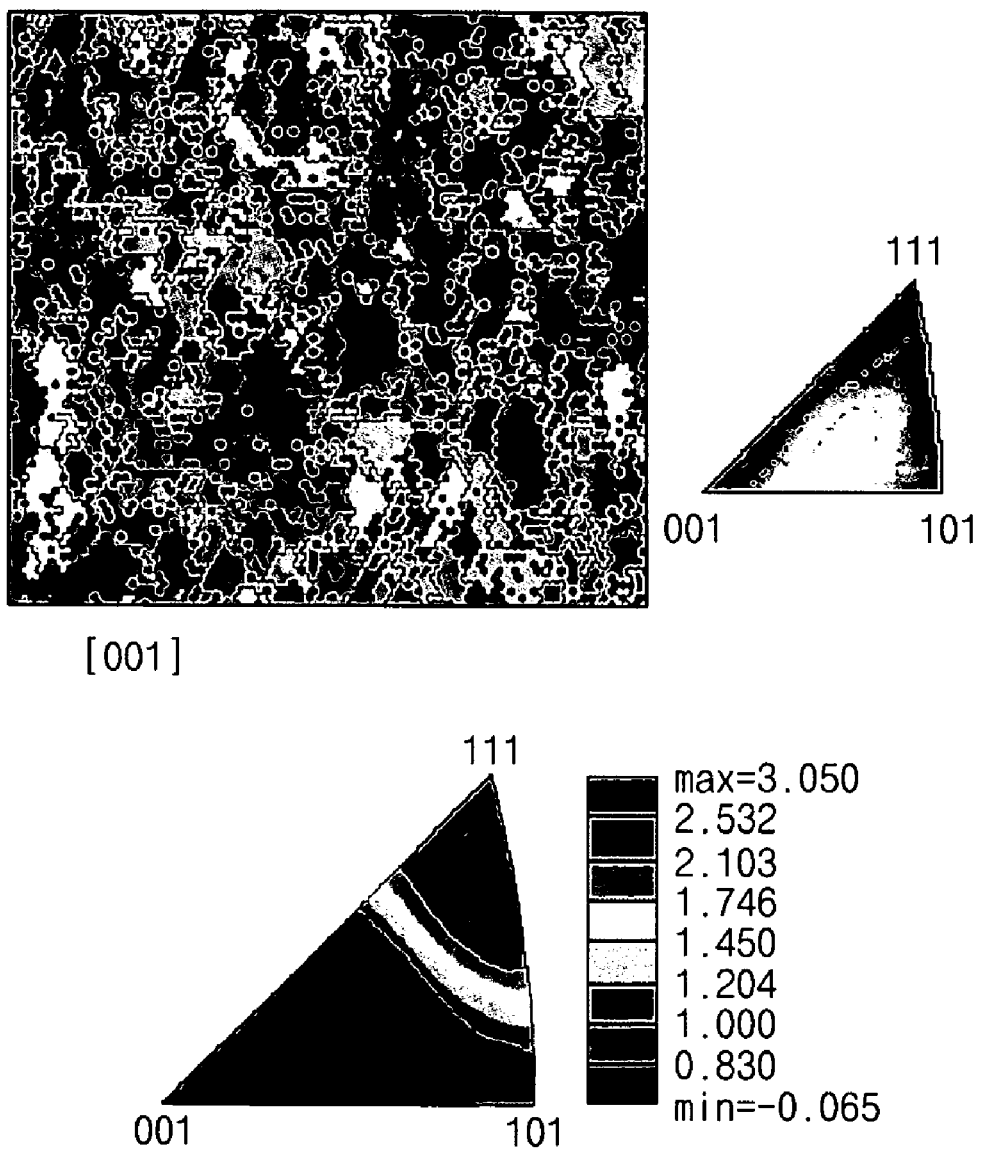
FIG. 12A is an image illustrating an orientation of crystals in aluminum alloy using EBSD.

FIG. 12A is an image illustrating an orientation of crystals in aluminum alloy using EBSD, FIG. 12B is an image illustrating an orientation of crystals in aluminum alloy formed on a conductive layer comprising molybdenum using EBSD.

Referring to FIGS. 12A and 12B, when the aluminum based alloy is formed on a conductive layer comprising Mo, crystals having a (111) orientation increases in the aluminum based alloy. Accordingly, the aluminum based alloy comprising the conductive layer has a (111) preferential orientation.

The crystals having the (111) orientation are arranged in a more dense lattice structure and the crystals have size that is capable of preventing the diffusion of the aluminum atoms from the aluminum based alloy. Thus, when the aluminum based alloy is formed on the conductive layer comprising Mo after the conductive layer comprising Mo is formed on the active pattern 130 and the ohmic contact pattern 140. The conductive layer comprising Mo may prevent the diffusion of the aluminum atoms from the aluminum based alloy, thereby preventing contamination of the active pattern 130 and the ohmic contact pattern 140. In one exemplary embodiment, the second and fourth metal patterns 155b and 155c include an aluminum based alloy having nickel ($Al_x Ni_y Z_z$ where Z is/are optional other metals and $x+y+z=100\%$, where $50\% < x < 100\%$ and $0 < y \ltoreq 3\%$). However, in addition to Ni the second and fourth metal patterns 155b and 155c may further include lanthanum or boron. For example, the aluminum based alloy may include about 96% to 99% aluminum and about 3% atomic or less of nickel atoms. Optionally, the aluminum based alloy may further include about 0.5% atomic or less of lanthanum atoms. Optionally, in addition to the 3% atomic or less of nickel atoms, the aluminum based alloy may further include about 0.2% atomic or less of boron atoms. Inclusion of more than about 3% atomic of nickel atoms is not desirable because, although Ni helps prevent corrosion, excess amounts of Ni in the Al alloy can interfere with dry etching of the Al alloy. Inclusion of more than about 0.5% atomic of lanthanum atoms or 0.2% atomic of boron atoms is not desirable because, although lanthanum and boron may improve the corrosion resistance of Al alloy, excess amounts of lanthanum or boron may increase contact resistance. So a balance has to be found between the desired amount of corrosion inhibition and the ease with which the AlNi-containing metal can be dry etched.

In the same or another exemplary embodiment, the first and third metal patterns 152b and 152c include at least one of molybdenum, titanium and tantalum or an alloy of two or more of said Mo, Ti and Ta. When provided essentially alone, Mo can be easily wet-etched. However addition to the Mo in the first and third metal pattern 152b and 152c or substitution thereof by one or both titanium and tantalum in lieu of molybdenum generally requires dry etching as opposed to selective wet etching. So choice of the metal or metals used in the first and third metal patterns 152b and 152c may depend on what type of selective etch process is most readily and/or economically available.

Further, the gate line GL (see FIG. 1) may include a same material as the data line, the source electrode 160, and the drain electrode 165. When the gate line GL includes the AlNi-containing aluminum based alloy, the gate line GL may be formed on the first substrate 100 that serves as an insulating member and the contact resistance between the gate line GL and the first substrate 100 does not need to be reduced, so that an additional molybdenum layer is not necessary to be formed on the gate line GL.

FIG. 3 is a sectional view showing another exemplary embodiment of a liquid crystal display panel according to the present disclosure. In FIG. 3, the same reference numerals denote the same elements in FIGS. 1 and 2, and thus the detailed descriptions of the same elements will be omitted.

Referring to FIG. 3, the source electrode 155d and the drain electrode 155e may have a single-layered structure of the aluminum based alloy containing nickel. In case that the source electrode 155d and the drain electrode 155e include the single-layered structure, the surfaces of the source and drain electrodes 155d and 155e are inhibited from being corroded while forming the source and drain electrodes 155d and 155e since the metal material of the source and drain electrode 155d and 155e has the superior corrosion resistance property. Accordingly, when the source electrode 155d and the drain electrode 155e are formed, the additional processes may be omitted, such as ashing of residues on the source electrode 155d and the drain electrode 155e, removing of the ions on the source electrode 155d and the drain electrode 155e.

Also, the drain electrode 155e of the aluminum based alloy may make direct contact with the pixel electrode PE, so that the drain electrode 155e and the pixel electrode PE may be electrically connected to each other. Thus, no additional conductive layer such as of the metal containing molybdenum need be formed on the drain electrode 155e, thereby simplifying the structure of the liquid crystal display panel.

In the present exemplary embodiment, the source electrode 155d and the drain electrode 155e include the aluminum based alloy containing nickel. However, the source electrode 155d and the drain electrode 155e may further include lanthanum or boron as described above.

FIGS. 4 to 10 are process views illustrating a method of manufacturing the liquid crystal display panel of FIG. 1.

Referring to FIGS. 4 and 5, after the gate electrode 110 is formed on the first substrate 100, a gate insulating layer 120 is formed on the first substrate 100 to cover the gate electrode 110.

The active pattern 130 and the ohmic contact pattern 140 are sequentially formed on the gate insulating layer 120 corresponding to the gate electrode 110. In order to form the active pattern 130 and the ohmic contact pattern 140, an active layer (not shown) and an ohmic contact layer (not shown) are sequentially formed on the first substrate 100, the ohmic contact layer and the active layer are successively etched by using the same photomask through a photolithography process.

Referring to FIGS. 6 to 8, after the active pattern 130 and the ohmic contact pattern 140 are formed on the first substrate 100, the first metal layer 152a is formed on the first substrate 100 using a sputtering method to cover the active pattern 130 and the ohmic contact pattern 140. The first metal layer 152a is a metallic material containing molybdenum, or optionally Ti and/or Ta in addition to the Mo or in lieu of the Mo as explained above.

Then, the second metal layer 155a is formed on the first metal layer 152a. The second metal layer 155a may include an aluminum based alloy containing about 96% to 99% atomic Al and about 3% atomic or less of nickel, or optionally further including at least one of lanthanum and boron in smaller quantities as explained above.

After forming the AlNi-containing second metal layer 155a on the first metal layer 152a, a photoresist pattern (not shown) is formed on the second metal layer 155a. The first and second metal layers 152a and 155a are successively dry-etched using the photoresist pattern as an etch mask. As a result, the source electrode 160 including the first and second metal patterns 152b and 155b and the drain electrode 165 including the third and fourth metal patterns 152c and 155c are formed.

Also, after the source electrode 160 and the drain electrode 165 are formed, an etch-back process is performed to etch a portion of the ohmic contact pattern 140 using the source and drain electrodes 160 and 165 as an etch mask.

In the present exemplary embodiment, the source electrode 160 and the drain electrode 165 are formed by dry-etching the first and second metal layers 152a and 155a. This is because shapes of the etched portions of the first and second metal layers 152a and 155a may be readily controlled when the first and second metal layers 152a and 155a are formed by a dry etch process than that when the first and second metal layers 152a and 155a are formed by a wet etch process. Thus, the first and second metal layers 152a and 155a may be prevented from being over-etched, thereby preventing a parasitic capacitor from being formed, which is defined by a portion of the active pattern not covered by the source and drain electrodes 160 and 165 and the pixel electrode PE (shown in FIG. 10).

When the patterning process for the first and second metal layers 152a and 155a is completed, the source electrode 160 including the first metal pattern 152b and the second metal pattern 155b and the drain electrode 165 including the third metal pattern 152c and the fourth metal pattern 155c are formed.

Since the second metal pattern 155b and the fourth metal pattern 155c include the AlNi-containing alloy having the superior corrosion resistance, the corrosion byproduct compounds may be substantially prevented from being formed on the surfaces of the source and drain electrodes 160 and 165 after the source and drain electrodes 160 and 165 are formed. Also, the first to fourth metal patterns 152b, 155b, 152c, and 155c have a small reactivity to the ions, so that the process of removing the residue ions on the surfaces of the first to fourth metal patterns 152b, 155b, 152c, and 155c may be omitted before or after etching the first metal layer 152a (see, FIG. 6) and the second metal layer 155a (see, FIG. 7). Consequently, the manufacturing processes for the liquid crystal display panel may be simplified, thereby reducing the manufacturing cost of the liquid crystal display panel.

Figure 9:
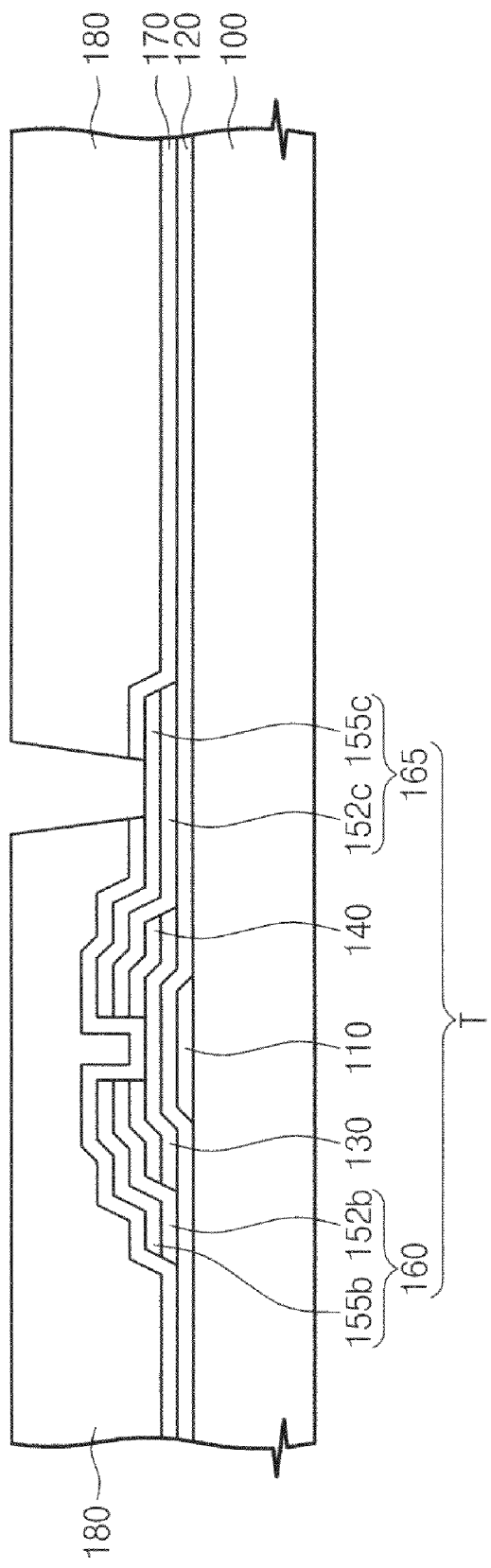
Figure 10:
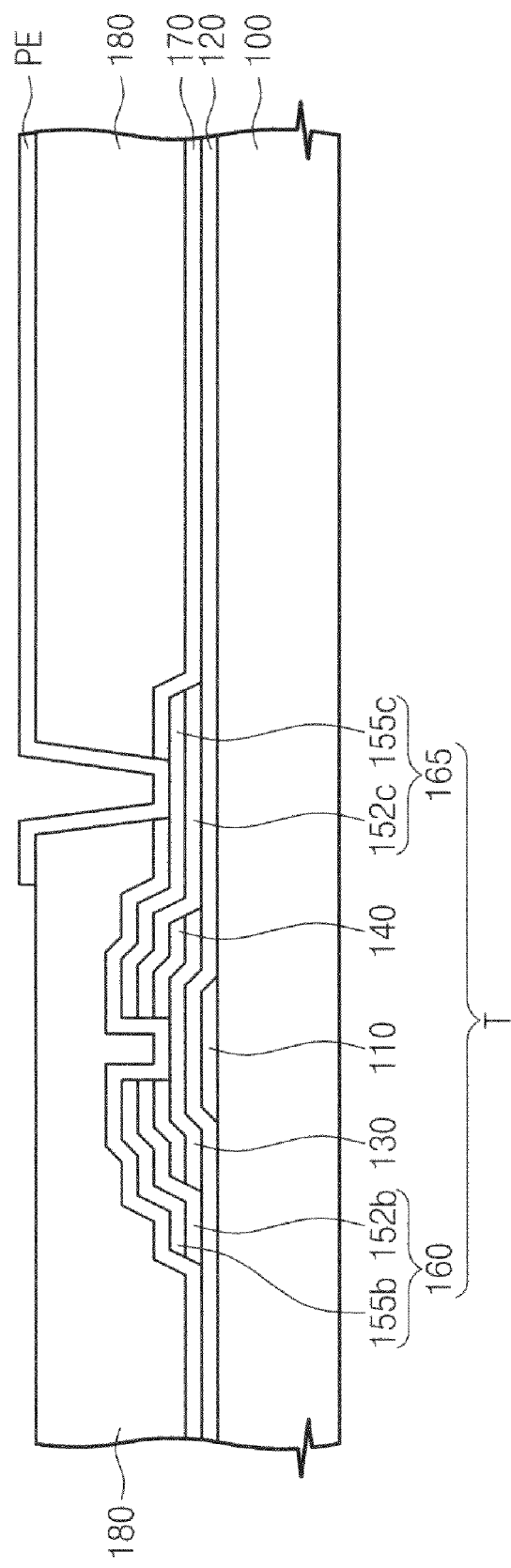

Referring to FIGS. 9 and 10, after forming the source and drain electrodes 160 and 165, an inter-insulating layer 170 and an organic insulating layer 180 are sequentially formed over the first substrate 100. The inter-insulating layer 170 and the organic insulating layer 180 are patterned to expose a portion of the fourth metal pattern 155c. Then, the pixel electrode PE is formed on the organic insulating layer 180, and the pixel electrode PE is electrically connected to the fourth metal pattern 155c through the inter-insulating layer 170 and the organic insulating layer 180.

Although not shown in figures, when the pixel electrode PE is formed on the organic insulating layer 180, the liquid crystals 200 (see, FIG. 2) are dropped onto the first substrate 100 and the second substrate 300 is combined with the first substrate 100, and thus the liquid crystal display panel 500 is basically completely manufactured.

FIG. 11 is a process view illustrating a method of manufacturing the liquid crystal display panel of FIG. 3. In FIG. 11, the same reference numerals denote the same elements in FIG. 3, and thus the detailed descriptions of the same elements will be omitted. Also, in FIG. 11, the manufacturing processes that are same as those illustrated in FIGS. 4 to 10 will be omitted.

Referring to FIG. 11, the second metal layer 155a is formed on the first substrate 100 on which the gate electrode 110, the active pattern 130, and the ohmic contact pattern 140 are formed. The second metal layer 155a may include the AlNi-containing alloy and optionally further including lanthanum or boron.

In the present exemplary embodiment, the second metal layer 155a is formed on the ohmic contact pattern 140 and the gate insulating layer 120 in such a manner that the second metal layer 155a directly makes contact with the ohmic contact pattern 140 without forming the first metal layer 152a (refer to FIG. 6).

When the second metal layer 155a is formed, the second metal layer 155a is patterned to form the source electrode 155d (refer to FIG. 3) and the drain electrode 155e (refer to FIG. 3). Thus, the source and drain electrodes according to the present exemplary embodiment have a single-layered structure of the aluminum based alloy.

According to the display panel and the method of manufacturing the display panel, the data line, the source electrode, and the drain electrode include the aluminum based alloy containing sufficient nickel to substantially inhibit corrosion and this AlNi-containing alloy may directly make contact with the pixel electrode and have the small reactivity to the ions, so that the process of removing the residue ions on the surface of the second metal layer may be omitted. Thus, the manufacturing processes for the liquid crystal display panel may be simplified, thereby reducing the manufacturing cost of the liquid crystal display panel.

Although the exemplary embodiments have been described, it is understood that the present disclosure should not be limited to these exemplary embodiments but various changes and modifications can be made by one ordinary skilled in the art in view of the foregoing and within the spirit and scope of the present disclosure.

What is claimed is:

1. A method of manufacturing a display panel, comprising:
   preparing a first substrate;
   forming a gate line on the first substrate;
   forming a semiconductor pattern partially overlapped with the gate line;
   forming a data line on the first substrate to define a pixel area together with the gate line;
   forming a source electrode branched from the data line in the pixel area;
   forming a drain electrode spaced apart from the source electrode in the pixel area and the drain electrode comprising a same material as the source electrode;
   forming a pixel electrode electrically connected to the drain electrode in the pixel area; and
   combining the first substrate and a second substrate facing the first substrate,
   wherein the source and drain electrodes are formed by:
   forming on the first substrate, an aluminum based alloy layer containing a sufficient amount of nickel to substantially inhibit corrosion during dry etching of the aluminum based alloy layer; and
   patterning the aluminum based alloy layer.

2. The method of claim 1, wherein the gate line comprises a same material as the data line.

3. The method of claim 1, wherein the aluminum based alloy layer further comprises lanthanum.

4. The method of claim 1, wherein the aluminum based alloy layer further comprises boron.

5. The method of claim 1, wherein the data line, the source electrode, and the drain electrode are formed by:
  forming a conductive layer comprising at least one of molybdenum, titanium, and tantalum on the first substrate prior to forming the aluminum based alloy layer; and
  patterning the conductive layer.

6. The method of claim 5, wherein the aluminum based alloy comprising the conductive layer has a (111) preferential orientation.

7. The method of claim 5, wherein the semiconductor pattern is formed under the source and drain electrodes and makes contact with the conductive layer.

8. The method of claim 5, wherein the conductive layer has a thickness of about 50 angstroms to about 1000 angstroms.

9. The method of claim 1, wherein the data line, the source electrode, and the drain electrode are shaped by a dry etching method.

* * * * *